PRINTED CIRCUIT BOARD AND MACHINE FOR SOLDERING SAME

Filed Jan. 23, 1964 2 Sheets-Sheet 1

INVENTOR
GEORGE J. SHOMPHE
BY
ATTORNEY

PRINTED CIRCUIT BOARD AND MACHINE FOR SOLDERING SAME

Filed Jan. 23, 1964 2 Sheets-Sheet 2

INVENTOR
GEORGE J. SHOMPHE
BY [signature]
ATTORNEY

United States Patent Office 3,298,588
Patented Jan. 17, 1967

3,298,588

PRINTED CIRCUIT BOARD AND MACHINE FOR SOLDERING SAME

George J. Shomphe, Nashua, N.H., assignor to Sanders Associates, Inc., Nashua, N.H., a corporation of Delaware

Filed Jan. 23, 1964, Ser. No. 339,712
10 Claims. (Cl. 228—20)

This invention relates to what are known as "printed circuit boards," or "printed circuits," and provides a board with improved connections to the conductors of said board, a new method for establishing such connections, and a new machine for soldering connections to the board.

It is well known that in employing printed circuits, and particularly circuits on both sides of the board, difficulties are encountered in establishing soldered connections to the board and from conductors on one side to conductors on the other side of the board, especially when the soldering is done by a machine instead of manually.

Heretofore, connections to the board conductors have frequently been made by drilling through the board in a conductor area on one or both sides of the board and applying a protective coating where solder is not desired. After this, the board is dip-soldered and shaken to remove the excess solder clinging to the eyelet area. The difficulties above mentioned interfere with establishing a rigid mechanical connection and a solid and reliable electrical connection to the board conductor. An excess amount of solder almost invariably remains, forming an uneven coat around the eyelet area which makes it diffi- air pockets being formed under the eyelet. This is likely to introduce circuit noise. Another difficulty is that the hole provided for the eyelet is left filled with solder, and a separate operation is necessary to open it before the eyelet can be inserted.

Among the objects and advantages of this invention may be mentioned:

To provide a method and apparatus using spray soldering and liquid blast-off to remove excess solder;

To provide a method and apparatus which forms a smooth, even deposition of solder;

To provide a method and apparatus which will result in a solid, rigid seating for the eyelet, thereby making a good electrical and mechanical connection preventing circuit noise and leaving the eyelet hole open, eliminating the necessity of punching solder out of the eyelet holes;

To provide a circuit board having new and improved connections to the board and between conducting areas on opposite sides of the board.

Still other objects and advantages of this invention will be apparent from the specification.

The features of novelty which are believed to be characteristic of this invention are set forth with particularity in the appended claims. This invention itself, however, both as to its fundamental principles and as to its particular embodiments, will best be understood by reference to the specification and accompanying drawings in which:

Figures 1, 2, 3, 4:
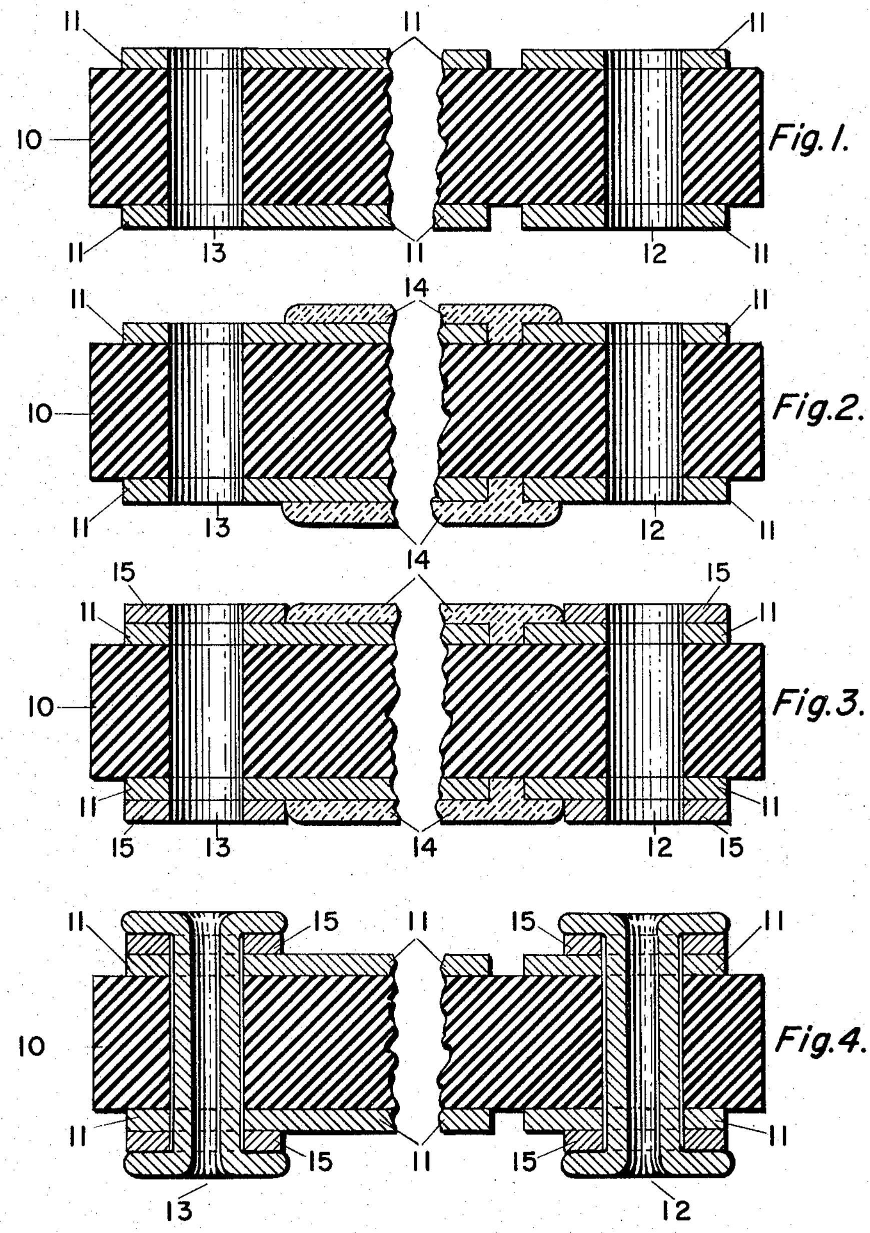
FIG. 1 is a sectional view of a printed circuit board before soldering, somewhat enlarged for clarity.
FIG. 2 is a similar view after the addition of a compound to protect the board from solder in undesired areas.
FIG. 3 is a similar view after the first application of solder (tinning)
FIG. 4 is a similar view after insertion of the eyelets and second soldering.

Referring now more particularly to FIG. 1, it is well known that a printed circuit board is prepared by employing a "laminate," consisting of a layer of insulating material to which a sheet or sheets of conductor such as copper are attached to one or both sides. The board is then covered with a resist except where the copper is to remain and etched to remove the undesired conductor material, leaving the desired pattern of conductors on one or both sides of the board.

In FIG. 1, 10 represents the layer of insulating material carrying the residual conductor pattern 11 left after etching, and having eyelet holes 12 and 13 to receive eyelets usually punched or drilled after etching is completed.

According to this invention, the conductor pattern is prepared for passage through the soldering machine by coating it with a protective coating 14, shown in FIG. 2, such as hysol, except in the eyelet or other areas to be tinned. Thus prepared, the board is passed through the soldering machine which applies a layer of solder 15 in the unprotected areas of the conductor pattern, as shown in FIG. 3. The steps which occur in the soldering machine will be described later in more detail but include those of fluxing, soldering, blasting off excess solder and degreasing.

Each board is run through the machine twice. On the first run, the contact areas for the eyelets are tinned. Before running through the machine the second time, the eyelets are inserted. During the second run, the eyelet areas are fluxed, soldered to the eyelet, and the excess solder is blasted off, forming an even deposit of solder with a smooth surface. If desired, the cover coat can be removed to produce the result shown in FIG. 4. This results in a rigid and reliable mechanical and electrical connection without air pockets under the eyelet and with freedom from circuit noise which would otherwise be introduced. Also, the blast-off during the first run prevents the eyelet holes from being filled with solder, which would otherwise have to be removed before insertion of the eyelets. Similarily, the blast-off during the second run clears the eyelets of solder for component insertion.

Figures 5, 6:
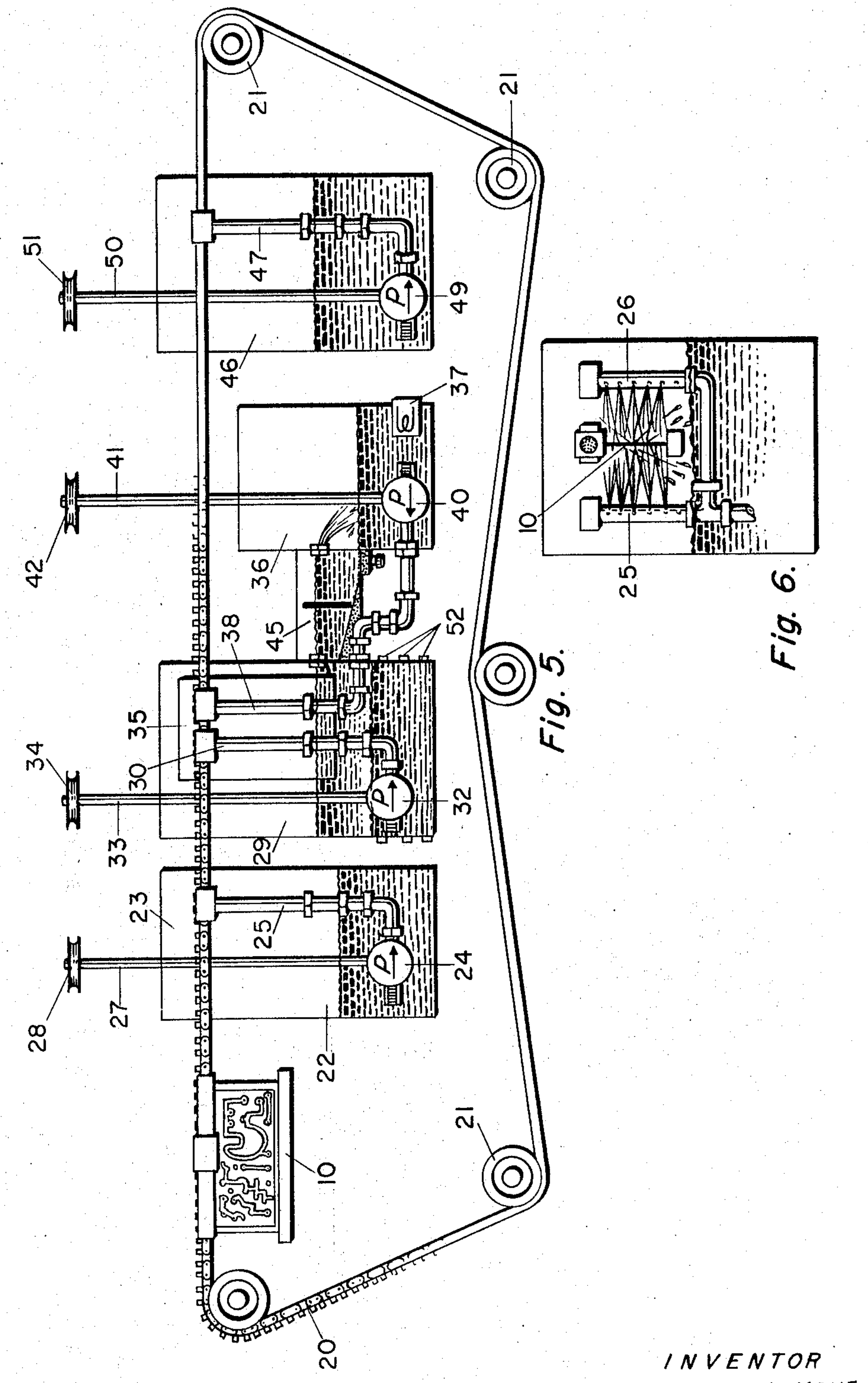
FIG. 5 is a partial sectional elevation of a soldering machine according to this invention.
FIG. 6 is a detail vertical sectional elevation of the sprays which are applied to both sides of the board simultaneously.

A machine particularly adapted to the process of this invention is shown in FIG. 5 to which reference is now had. A conveyor belt 20, to which the circuit board 10 is attached passes around rollers 21. As shown, the board 10 is attached to conveyor 20 at the left side of FIG. 5 and travels to the right first passing through the flux tank 22 and through flux spray 23. The flux liquid in this instance is rosin flux with isopropyl alcohol as a diluent, although other liquid fluxing compounds may be used.

The liquid flux in the flux tank 22 is pumped by pump 24 to vertical spray nozzles 25 and 26, which spray inwardly against board 10 as it passes between them, as shown more in detail in FIG. 6, the excess spray draining off from the board and falling back into the tank. Pump 24 may be driven by shaft 27, carrying drive pulley 28, energizing from any suitable power source, such as a belt driven by an electric motor (not shown).

The board 10 is then carried by conveyor 20 out of the fluxing tank 22 and into the soldering and blast-off tank 29, where solder is sprayed on both sides of board 10 by vertical solder spray nozzles 30 and 31 arranged as in FIG. 6. Liquid solder in the tank 29 is heated electrically by coils 52 and picked up by pump 32, driven by shaft 33 through drive pulley 34, energized similarly to pulley 28. A removable baffle 35 is provided in this example of the invention to confine the solder and blast-off operations to a small section of the tank 29, thereby preventing build-up of solder deposits on the tank walls.

The excess solder is blasted off both sides of the board almost immediately after soldering. The blast-off medium in this instance is peanut oil, although other suitable substances may be used. The blast-off liquid is stored in a separate tank 36, provided with a heating coil 37, and is pumped to the spray nozzles 38 and 39 by pump 40 driven by shaft 41 and drive pulley 42. The blast-off nozzles 38 and 39 are located close to the solder spray nozzles 30 and 31, about two inches downstream, which results in the blast-off occurring within two or three seconds after application of the solder. Because of the close proximity of the solder and blast-off nozzles, the solder is still in a molten liquid state when blast-off occurs, and a relatively low blast-off pressure will clear the eyelet area of solder and form a smooth, even coat of solder around the eyelet. The solder settling tank 45 between the solder and blast-off tank and the blast-off liquid storage and heating tank allows the blast-off oil to return to storage tank 36 relatively free of entrained solder.

The circuit board 10 after solder and blast-off passes to the degreasing tank 46, passing between vertical spray nozzles 47 and 48, where it is sprayed with any suitable degreasing liquid, impelled by pump 49, driven by shaft 50 and drive pulley 51. The board then passes out of the degreasing tank and is ready to be removed from the conveyor. The eyelet areas are now tinned (first run) or the eyelets soldered (second run). Before the next run can be made on a board which has passed through the machine, all traces of the blast-off oil must be removed. This usually requires a second step in the degreasing process, wherein the board is removed from the conveyor and placed in a solvent vapor bath, such as trichloroethylene or the equivalent. After final degreasing, the board is ready for its second run through the machine, or for component mounting, as the case may be.

In the foregoing specification, there is described the best mode of practicing this invention presently known to me, and for certain cases the preferred form, but it will be understood that modifications and changes may be made without departing from the spirit and scope of this invention as will be clear to those skilled in the art.

What is claimed is:

1. A spray soldering machine for soldering printed circuit boards comprising, in combination, containing means having liquid solder therein, means for spraying liquid solder disposed within said containing means, means operatively connecting said spray soldering means to said containing means, means for storing blast-off liquid, means for spraying blast-off liquid disposed within said containing means, means operatively connecting said blast-off liquid spraying means to said blast-off liquid storing means, and means for transporting circuit boards through said containing means for soldering and blast-off of excess solder.

2. A spray soldering machine for soldering circuit boards in accordance with claim 1, wherein said blast-off liquid spraying means disposed within said containing means is positioned closely adjacent said spray soldering means.

3. A spray soldering machine for soldering circuit boards in accordance with claim 1, wherein said spray soldering means sprays two jets of solder toward each other, said blast-off liquid spraying means sprays two jets of blast-off liquid toward each other, and said transporting means transports said circuit boards between said jets spraying toward each other.

4. The combination claimed in claim 3 in which said transporting means carries said boards first through the opposed solder jets and then through the opposed blast-off jets while the solder sprayed on said board is still liquid.

5. The combination claimed in claim 3, including a tank containing degreaser, said transporting means carrying said boards through said degreasing tank after they have passed through said solder and blast-off jets.

6. The combination claimed in claim 3, including a fluxing tank, said transporting means being arranged to carry said circuit boards through said fluxing tank and then through said solder and blast-off jets.

7. The combination claimed in claim 6, including a degreasing tank containing means for producing degreasing jets, said transporting means being arranged to carry said circuit boards in succession through said fluxing tank, through said solder and blast-off jets, and through said degreasing jets.

8. The combination claimed in claim 1, including further storing means for blast-off liquid, an overflow connection from said containing means to said further storing means for supplying used blast-off liquid to said further storing means, and means for transfering blast-off liquid from said further storing means to said blast-off liquid storing means.

9. In a spray soldering machine for soldering printed circuit boards, in combination, a spray solder and blast-off tank having solder contained therein, a tank for storing blast-off liquid, solder nozzles delivering a spray of solder operatively connected to said solder and blast-off tank and disposed therein, blast-off nozzles for delivering a spray of blast-off liquid disposed within said solder and blast-off tank closely adjacent said soldering nozzles, said blast-off nozzles being operatively connected to said blast-off liquid storing tank, and a conveyor carrying printed circuit boards successively through said solder and blast-off sprays, the rate of travel of said conveyor being such that the boards carried thereby reach said blast-off nozzles while said solder is still liquid.

10. In a spray soldering machine for soldering printed circuit boards, in combination, a conveyor for carrying said circuit boards, means for supplying flux to a first pair of spray nozzles for spraying flux on opposite sides of said boards simultaneously, means for supplying solder to a second pair of spray nozzles for spraying solder on opposite sides of said boards simultaneously, means for supplying blast-off liquid to a third pair of spray nozzles for spraying blast-off liquid on both sides of said boards simultaneously, means for supplying degreaser to a fourth pair of spray nozzles for spraying degreaser on both sides of said boards simultaneously, said conveyor carrying said boards past said first, second, third and fourth pairs of nozzles successively.

References Cited by the Examiner

UNITED STATES PATENTS

| | | | |
|---|---|---|---|
| 2,251,642 | 8/1941 | Tilley | 113—1 |
| 2,332,385 | 10/1943 | Lauring | 118—63 |
| 2,370,495 | 2/1945 | Sebell | 118—63 |
| 2,986,811 | 6/1961 | Rudd | 29—157.3 |

JOHN F. CAMPBELL, *Primary Examiner.*

M. L. FAIGUS, *Assistant Examiner.*